(12) United States Patent
Bergman Reuter et al.

(10) Patent No.: US 7,930,667 B2
(45) Date of Patent: *Apr. 19, 2011

(54) SYSTEM AND METHOD OF AUTOMATED WIRE AND VIA LAYOUT OPTIMIZATION DESCRIPTION

(75) Inventors: Bette L. Bergman Reuter, Essex Junction, VT (US); Howard S. Landis, Underhill, VT (US); Anthony K. Stamper, Williston, VT (US); Jeanne-Tania Sucharitaves, Williston, VT (US)

(73) Assignee: International Business Machines Corporation, Armonk, NY (US)

(*) Notice: Subject to any disclaimer, the term of this patent is extended or adjusted under 35 U.S.C. 154(b) by 765 days.

This patent is subject to a terminal disclaimer.

(21) Appl. No.: 11/465,473

(22) Filed: Aug. 18, 2006

(65) Prior Publication Data

US 2008/0046852 A1    Feb. 21, 2008

(51) Int. Cl.
G06F 9/455      (2006.01)
G06F 17/50      (2006.01)

(52) U.S. Cl. ........................ 716/122; 716/132

(58) Field of Classification Search ............... 716/2, 122, 716/130
See application file for complete search history.

(56) References Cited

U.S. PATENT DOCUMENTS

| | | | |
|---|---|---|---|
| 5,729,466 A | 3/1998 | Bamji | |
| 5,737,580 A * | 4/1998 | Hathaway et al. | 716/12 |
| 5,798,937 A | 8/1998 | Bracha et al. | |
| 5,835,378 A | 11/1998 | Scepanovic et al. | |
| 6,026,224 A | 2/2000 | Darden et al. | |
| 6,247,853 B1 * | 6/2001 | Papadopoulou et al. | 716/4 |
| 6,470,476 B2 | 10/2002 | Bednar et al. | |
| 6,507,930 B1 | 1/2003 | Bass, Jr. et al. | |
| 6,941,528 B2 | 9/2005 | Allen et al. | |
| 7,117,468 B1 * | 10/2006 | Teig et al. | 716/11 |
| 7,284,231 B2 * | 10/2007 | Lucas et al. | 716/21 |
| 7,312,141 B2 * | 12/2007 | Dunham et al. | 438/597 |
| 2003/0229875 A1 * | 12/2003 | Smith et al. | 716/10 |

OTHER PUBLICATIONS

Office Action dated Oct. 7, 2008 in U.S. Appl. No. 11/926,567.
Final Office Action dated May 1, 2009 in U.S. Appl. No. 11/926,567.
Office Action dated Jul. 24, 2009 in U.S. Appl. No. 11/926,567.
Notice of Allowance dated Jan. 28, 2010 in U.S. Appl. No. 11/926,567.

* cited by examiner

*Primary Examiner* — Jack Chiang
*Assistant Examiner* — Brandon W Bowers
(74) *Attorney, Agent, or Firm* — Richard Kotulak; Roberts Mlotkowski Safran & Cole, P.C.

(57) ABSTRACT

A system and method to optimize a circuit layout, and more particularly, to a system and method of post layout data preparation to optimize a circuit layout and reduce random and systematic wire and via opens and shorts. The method includes stripping existing vias in a design layout and determining design parameters of the design layout including wiring placement and dimensions. The method further includes optimizing via layout by placing vias away from edges of the wiring and adjacent vias.

19 Claims, 11 Drawing Sheets

SYSTEM AND METHOD OF AUTOMATED WIRE AND VIA LAYOUT OPTIMIZATION DESCRIPTION

FIELD OF THE INVENTION

The invention relates to a system and method to optimize a circuit layout, and more particularly, to a system and method of post layout data preparation to optimize a circuit layout and reduce random and systematic wire and via opens and shorts.

BACKGROUND DESCRIPTION

Integrated circuits can contain several million transistors on a single integrated circuit substrate. In order to interconnect these transistors to form a working device, as many as ten or more layers of conductive material may be formed overlying the substrate and the transistors to functionally interconnect the transistors. This interconnection or coupling is accomplished by the use of contacts or via structures.

Vias are typically openings etched through dielectric layers between the conductive layers. In modern semiconductor chip technology, vias are physically very small, the area of a via being limited to the area defined by the conjunction of signal wiring shapes on the corresponding layers. For example, due to the fine lithographic features that can be manufactured, many vias have dimensions of less than one micron. For example, 0.1 micron wide wires can have a via of 0.1 micron wide by 0.1 micron wide. In practice, the via might even be smaller to allow for misregistration of the via on the wires, or to allow for other process tolerances. However, the extremely small size of the vias increases the probability, given normal process defect densities and tolerances, of defects and hence degraded device performance and yield.

As electronic circuit densities increase and technology advances, for example, in deep sub-micron circuits, there is a need to maximize the utilization of the design layout and manufacturability and reliability of the circuit. This can be accomplished, for example, by adding redundant vias and the like. Thus, some design systems or graphics technicians will, after normal wiring is complete, add redundant vias, where possible, to enhance yield. However, these added vias, in many instances, can be located very close to one another or near edges of the wires, resulting in or increasing the probability of via to adjacent via or wire shorting. Also, it is known that densely packed vias suffer from processing problems such as over etching of the underlying dielectric layer, to name but one problem.

Accordingly, there exists a need in the art to overcome the deficiencies and limitations described hereinabove.

SUMMARY OF THE INVENTION

In a first aspect of the invention, a method comprises stripping existing vias in a design layout and determining design parameters of the design layout including wiring placement and dimensions. The method further includes optimizing via layout by placing vias away from edges of the wiring and adjacent vias.

In another aspect of the invention, a system comprises a device configured to at least determine design parameters of the design layout including wiring placement and dimensions, and optimize via layout by placing vias away from edges of the wiring and adjacent vias.

In another aspect of the invention, a computer program product comprising a computer useable medium including a computer readable program, wherein the computer readable program, when executed on a computer, causes the computer to implement the steps of the invention.

BRIEF DESCRIPTION OF THE DRAWINGS

FIGS. 5-8 show illustrative examples in accordance with the invention; and

DETAILED DESCRIPTION OF EMBODIMENTS OF THE INVENTION

The invention is related to a system and methodology for optimizing a circuit layout. In particular, the invention relates to a system and method of post layout data preparation to optimize a circuit layout and reduce random and systematic wire and via opens and shorts. In embodiments, this is accomplished by, for example, expanding via shapes, replacing a single, small via structure with a larger via structure, replacing one or more smaller via structures with a single via structure of a particular shape, adding or rearranging via structures at certain locations and/or of certain sizes. Additionally, by implementing the invention, via structures can be implemented in wiring areas having only a limited available space. The invention also contemplates optimizing wiring shapes and locations.

Figure 1:
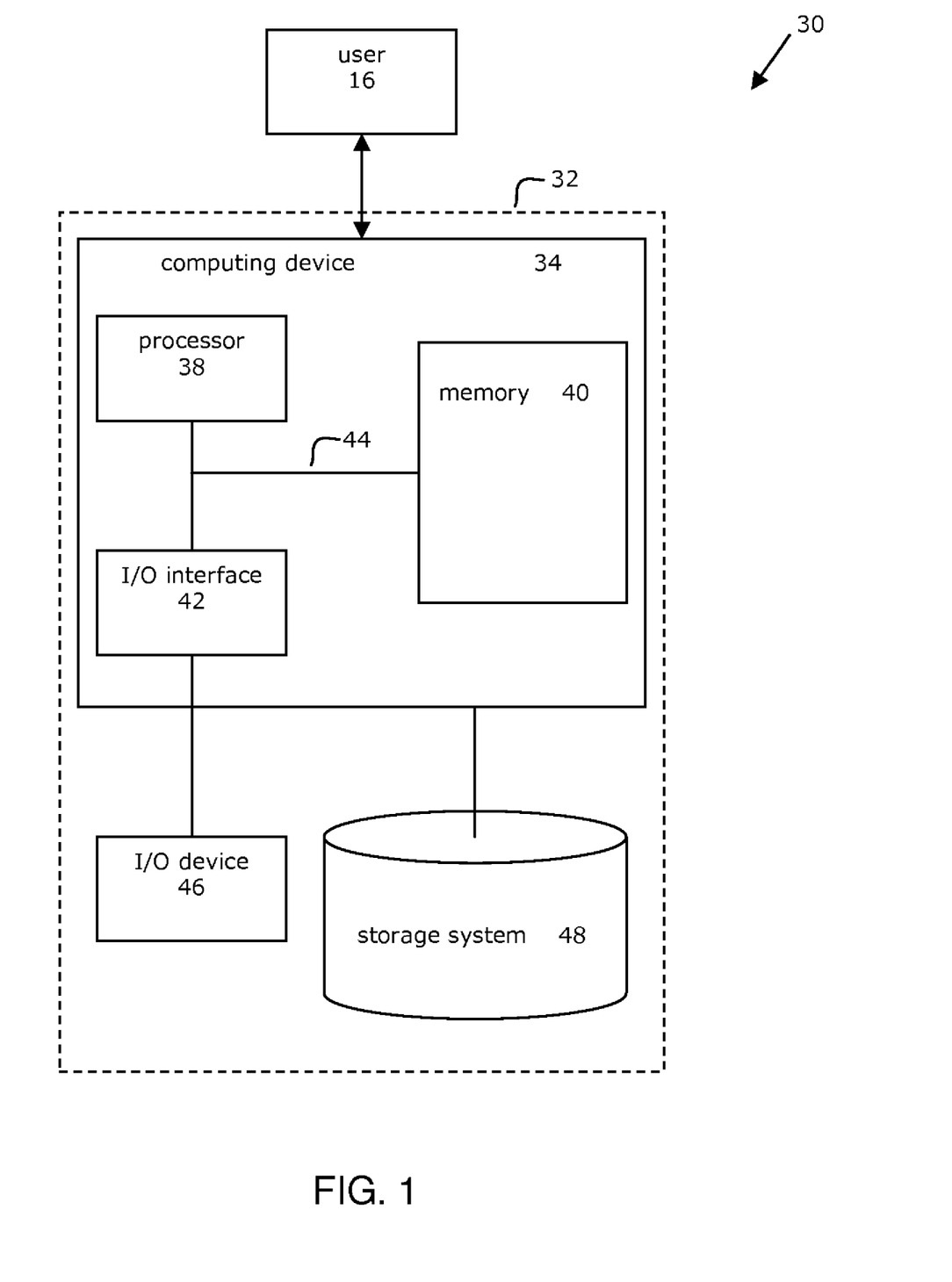
FIG. 1 shows an environment for implementing an aspect of the invention.

With reference to the accompanying drawings, FIG. 1 shows an illustrative environment 30 for managing the processes in accordance with the invention. To this extent, the environment 30 includes a computer infrastructure 32 that can perform the processes described herein. In particular, the computer infrastructure 32 is shown including a computing device 34 operable to perform the processes described herein. The computing device 34 is shown including a processor 38, a memory 40, an input/output (I/O) interface 42, and a bus 44. Further, the computing device 34 is shown in communication with an external I/O device/resource 46 and a storage system 48. As is known in the art, in general, the processor 38 executes computer program code, which is stored in memory 40 and/or storage system 48. While executing computer program code, the processor 38 can read and/or write data, such as the range boundary 50, to/from memory 40, storage system 48, and/or I/O interface 42. The bus 44 provides a communications link between each of the components in the computing device 34. The I/O device 46 can comprise any device that enables an individual to interact with the computing device 34 or any device that enables the computing device 34 to communicate with one or more other computing devices using any type of communications link.

In any event, the computing device 34 can comprise any general purpose computing article of manufacture capable of executing computer program code installed thereon (e.g., a personal computer, server, handheld device, etc.). However, it is understood that the computing device 34 is only representative of various possible equivalent computing devices that may perform the processes described herein. Similarly, the computer infrastructure 32 is only illustrative of various types of computer infrastructures for implementing the invention.

For example, in one embodiment, the computer infrastructure 32 comprises two or more computing devices (e.g., a server cluster) that communicate over any type of communications link, such as a network, a shared memory, or the like, to perform the process described herein.

In implementation, the present invention uses post layout data preparation (data prep) to optimize the circuit layout to reduce random and systematic wire/via opens and shorts, which can be implemented in the above environment. By way of illustrative example, referring to FIG. 2, a positioning of contacts and/or via structures can be based on the intersection area of the wires which may include, for example, a reorganizing (e.g., placement and/or size) of via structures to eliminate an isolated via structure; reduce dense via farms; or eliminate via to adjacent via or wire shorting, to name but a few advantages. In implementing the present invention, copper electro-migration rules are maintained.

Figure 2:
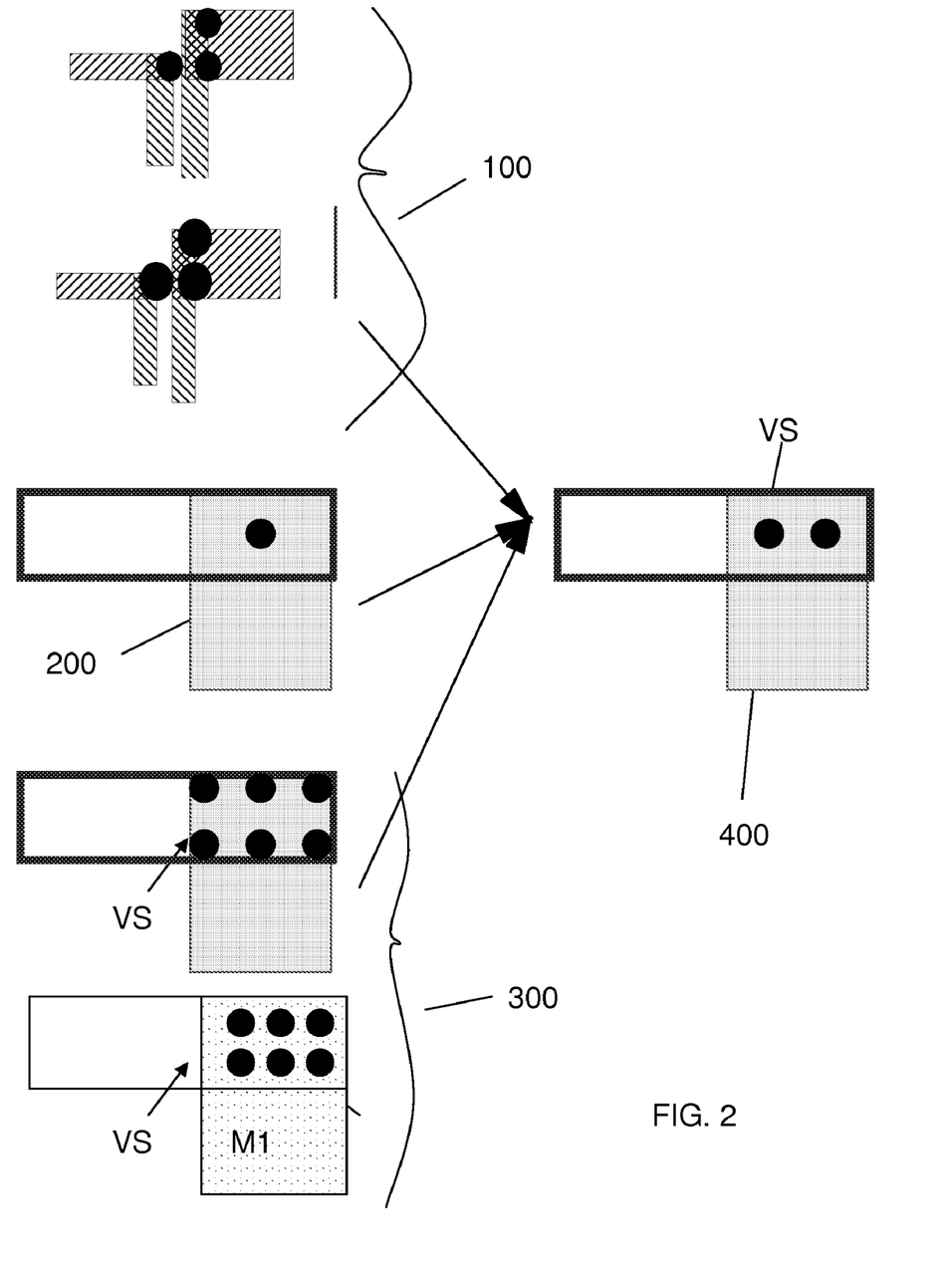
FIG. 2 shows an illustrative example in accordance with the invention.

More specifically, in the illustrative example of FIG. 2, a first level of on-chip wiring M1 level is shown; although, it should be understood by those of skill in the art that FIG. 2 may represent any level including other wiring levels, MOSFET gate level, silicon substrate diffusion level, bipolar junction terminal, passive circuit element, etc. In representation 100, via structures "VS" are provided near an edge of the wiring layer, and are misaligned causing short to adjacent wire or via due to such misalignment and/or due to the wire width tolerance (e.g., wide wire). Representation 100 further shows a representation of a large via. In representation 200, a single via structure "VS" is provided, and in representation 300, a densely packed via farm "VS" is provided, with the via structures "VS" arranged close to one another and at edges of the wiring.

In representations 100 and 300, via to wire shorting may occur due to the placement of the via structures "VS" near the edges of the wiring, for example. In representation 200, there are no redundant vias, which may impair performance of the device and yield.

Still referring to FIG. 2, representation 400 is an illustrative example of a via structure implemented in accordance with the invention. In this non-limiting example, the via structures "VS" of representations 100, 200 and 300 are stripped out of the layout and thereafter repositioned or optimized based on the design criteria. For example, in this illustrative example, the use of two via structures "VS", in representation 400, are substituted for the via structures "VS" of representations 100, 200 and 300. In embodiments, two via structures were chosen since they could be spaced sufficiently apart from one another and the edge of the wiring such that shorting would not occur. Thus, by substituting the two via structures "VS", in representation 400 the via structures "VS" are provided away from the edges, and spaced apart from one another thus preventing wire shorting as well as via to adjacent via shorting. As discussed in more detail below, this placement is based on, for example, the size of the wiring layer, the size and location of possible via structures and the overall design parameters. Alternatively, the circuit designer could designate that via interconnection is required on wiring levels one above the other as shown in 400.

Figure 3:
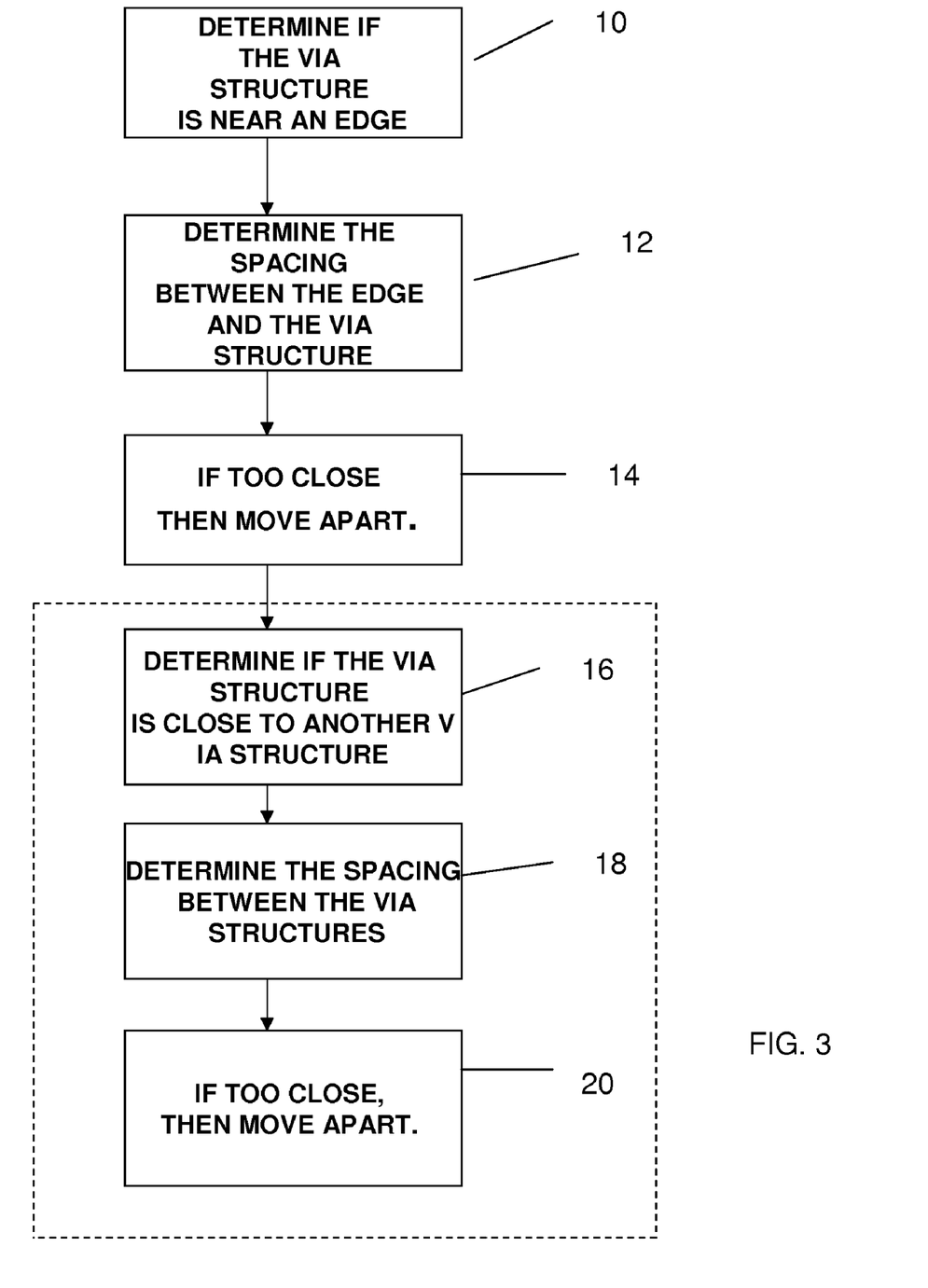
FIG. 3 is a flow chart illustrating steps in accordance with the invention.

FIG. 3 is a flow chart showing steps implementing the invention. The steps of FIG. 3 (as well as any other flows) may be representative of a high-level block diagram implementing the steps thereof. The steps of the invention can be implemented in the above environment and may take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium, all well known to those of skill in the art.

Still referring to FIG. 3, at step 10, a determination is made as to whether any via structure is near an edge of the wiring. At step 12, a determination is made as to the distance between the edge of the wiring and the via structure (e.g., whether shorting is possible). If the via structure is too close to the edge, e.g., a predetermined distance based on design criteria, at step 14, the via structure is moved away from the edge, taking into account design criteria such as, for example, the dimensions of the wiring, sheet resistance, dimensions of the vias, overall required redundancy and resistivity of the vias etc. In alternative embodiments, the width of the via structure can be reduced thus effectively increasing the spacing between the via structure and the edge (e.g., see tables below). In still further embodiments, the shape of the via structure can be altered to space it away from the edge(s) (e.g., see FIG. 4). One example, for 130 nm generation wiring, is shown in Table 1.

Still referring to FIG. 3, at step 16, a determination is made as to whether any via structure is near another via structure. At step 18, a determination is made as to the distance between the via structures, to determine whether shorting is possible. If the via structures are too close, e.g., resulting in or the probability of via to adjacent via shorting, at step 20, the via structures are spaced apart from one another (moved), keeping away from the edges.

Figure 4A:
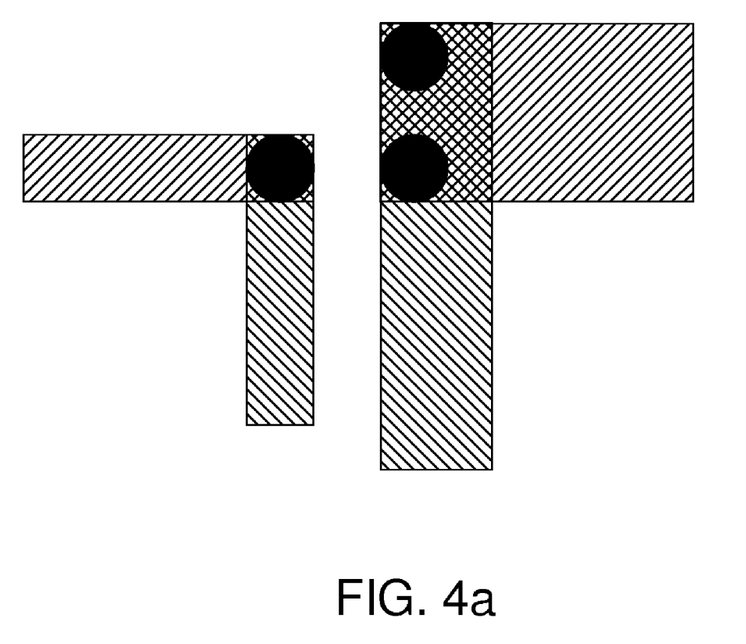
FIG. 4a-4d show examples in accordance with an embodiment of the invention.
Figure 4B:
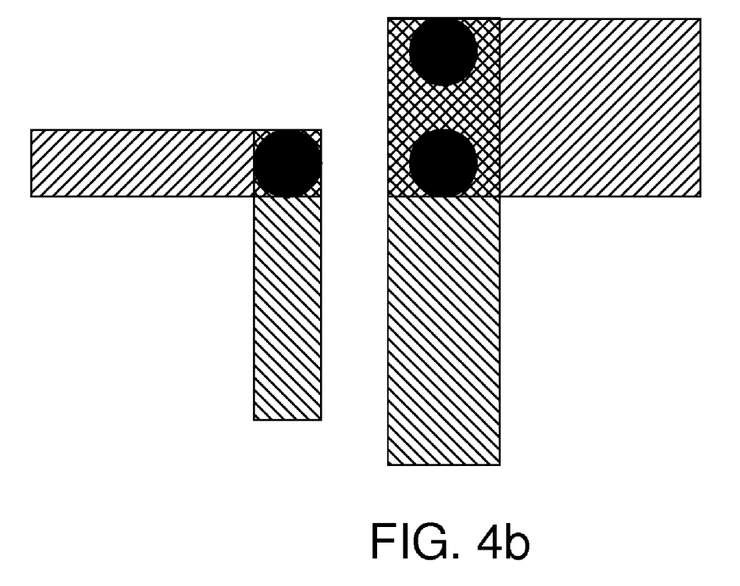
Figure 4C:
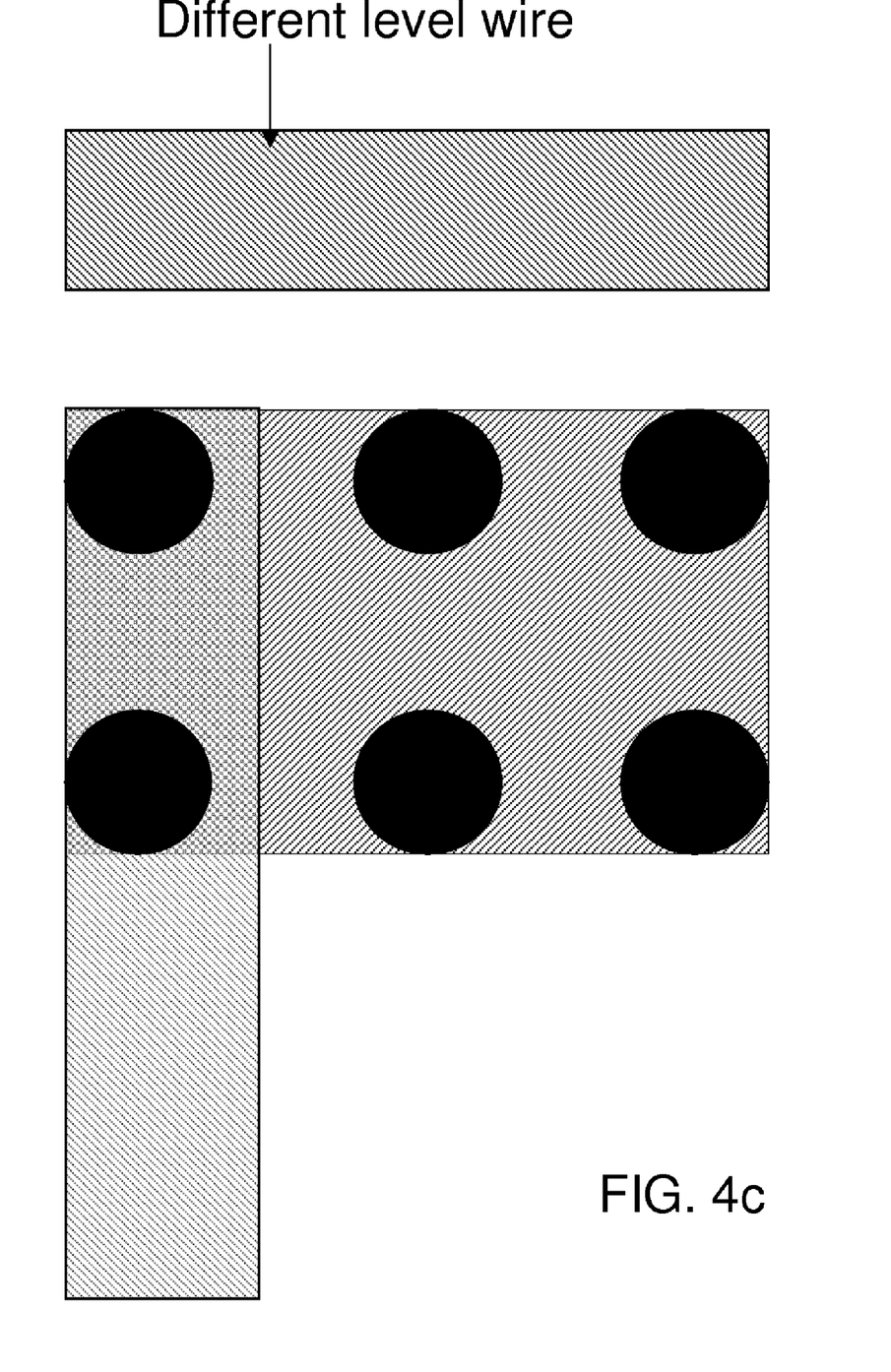
Figure 4D:
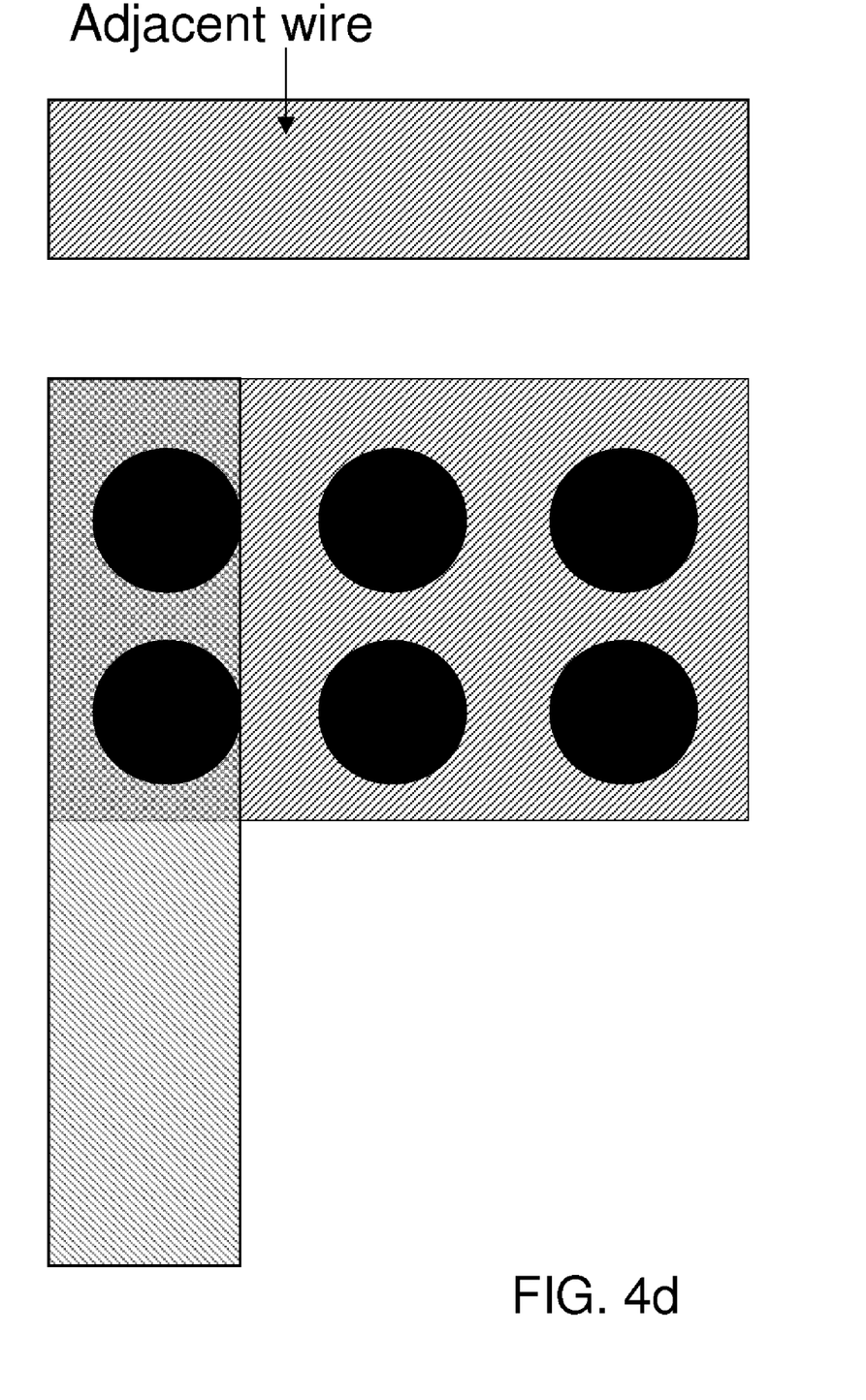

In one example, as shown in FIGS. 4a and 4b, two 0.10 micron vias are displaced 0.02 microns so that the likelihood of shorting to the vias in the adjacent wiring network is reduced. FIG. 4d further shows that the vias are pulled back or pulled "in-board" in the x and y plane so that the vias are inside on both metal above and metal below (compared to FIG. 4c which shows the vias at the edge of the wiring). It should further be understood that vias are typically tapered such that shorts to adjacent wire or via may result at one level (see, FIG. 4d), but not at another level due to the taper (see, FIG. 4c).

In an alternative embodiment, the number of vias connecting two wires could be reduced, thus effectively increasing the spacing between the via structures. For this embodiment, when the number of vias is reduced, it is required that the remaining vias are sufficient to carry the required current with excessive resistance or electromigration. In still further embodiments, the shape of the via structure can be altered to eliminate the need for redundant via structures (e.g., see FIG. 5). For example, two 100 nm via holes spaced 100 nm apart could be replaced by one 200 nm long, 100 nm wide via bar. It should be recognized that steps 16-20 may be separated from steps 10-14, and that the ordering of the above steps is but one of many possible sequences.

In embodiments, the via movement is determined by wire intersection x and y cross-section In an illustrative example:

Via width: 100 nm

Minimum space between vias connecting wires in the same network: 100 nm

Minimum space between adjacent vias in different wiring networks: 120 nm

Minimum via border to wire above or below: 0 nm

Figure 5:
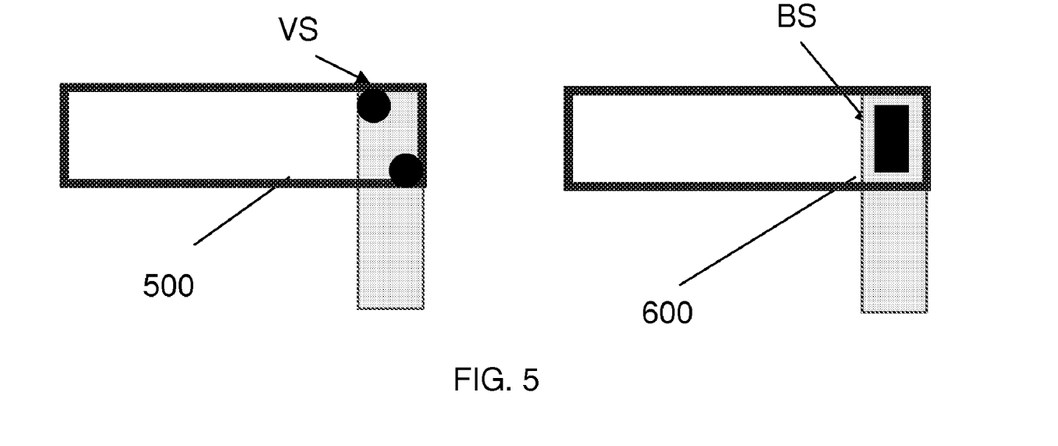

FIG. 5 represents another implementation in accordance with the invention. In this implementation, representation 500 is provided with two via structures "VS" near edges of the wiring due to the minimum dimensions of the wiring. In representation 600, the via structures "VS" of representation 500 (which may be representative of one or more vias) are converted to a bar structure "BS" to eliminate the probability of via to adjacent via or wire shorting. In this scenario, consideration is taken into account that via structures or contact holes could not be repositioned inside the wiring due to its smaller dimensions.

In further embodiments, the invention contemplates a schema in which the space adjacent to wide wires is increased by decreasing the wire width. In this manner, it is possible to increase the wire to wire space. It should be understood by those of skill in the art that decreasing the line width will increase the spacing between wires and decrease sensitivity to shorting. Such small reductions in line width would result in very small differences in the line resistance. It is believe of the inventors that the small difference in line resistance are contained within the noise from the process variables such as damascene final etch dimension and final polish metal height. Design manuals may be consulted to show wire width, and can be used to calculate the spacing between via structures, as well as other design parameters.

By way of examples using 130 nm generation values and a set of design rules with a 7 nm grid size, the following tables show illustrative examples of such a schema.

EXAMPLE "1"

| Wire width | Decrease Wire Width |
| --- | --- |
| 175 nm-343 nm | 7 nm per edge |
| 350 nm-10.5 um | 14 nm per edge |
| >10.493 um | 78 nm per edge |

EXAMPLE "2"

| Wire width | Decrease Wire Width |
| --- | --- |
| 203 nm-399 nm | 7 nm per edge |
| 406 nm-602 nm | 14 nm per edge |
| 609 nm-805 nm | 21 nm per edge |
| 812 nm-1.008 um | 28 nm per edge |
| 1.015 um-1.211 um | 35 nm per edge |
| >=1.218 um | 42 nm per edge |

EXAMPLE "3"

| Wire width | Decrease Wire Width |
| --- | --- |
| 399 nm-595 nm | 14 nm per edge |
| 602 nm-791 nm | 28 nm per edge |
| 798 nm-994 nm | 42 nm per edge |
| 1.001 um-1.19 um | 56 nm per edge |
| 1.204 um-1.498 um | 70 nm per edge |
| >1.5 um in narrow direction only | 78 nm per edge |

In further embodiments, the processes of the invention contemplate decreasing the wire width based on a grid point analysis. For example, a grid point is typically 2% to 5% of the minimum dimension of the wire width, e.g., a grid point is approximately 5 nm using 200 nm wire technology. In further embodiments, the total wire width should not be decreased by more than 5% of the wire width. Thus, using these guidelines, in a 200 nm wide wire, for example, the wire width may be decreased by approximately 5 nm (e.g., one grid point) to increase wire spacing, without affecting the integrity of the design.

In further embodiments, boxes, comprising a somewhat larger extent of metal, are "placed" around the via structures to avoid open via problems. Examples of this implementation are shown in the below tables. The placing of boxes around the vias may be used to reinsert the original metal wiring dimensions so that the via bordering is not changed. Examples 4-6 respectively correspond to examples 1-3, above.

EXAMPLE "4"

| Width | Decrease Wire Width |
| --- | --- |
| 175 nm-343 nm | 7 nm per edge |
| 350 nm-10.5 um | +14 nm per edge |
| >10.493 um | +78 nm per edge |

EXAMPLE "5"

| Width | Decrease Wire Width |
| --- | --- |
| 203 nm-399 nm | 0 nm per edge |
| 406 nm-602 nm | +7 nm per edge |
| 609 nm-805 nm | +14 nm per edge |
| 812 nm-1.008 um | +21 nm per edge |
| 1.015 um-1.211 um | +28 nm per edge |
| >=1.218 um | +35 nm per edge |

EXAMPLE "6"

| Width | Decrease Wire Width |
| --- | --- |
| 399 nm-595 nm | 0 nm per edge |
| 602 nm-791 nm | +14 nm per edge |
| 798 nm-994 nm | +28 nm per edge |
| 1.001 um-1.19 um | +42 nm per edge |
| 1.204 um-1.498 um | +56 nm per edge |
| >1.5 um in narrow direction only | +62 nm per edge |

Figure 6:
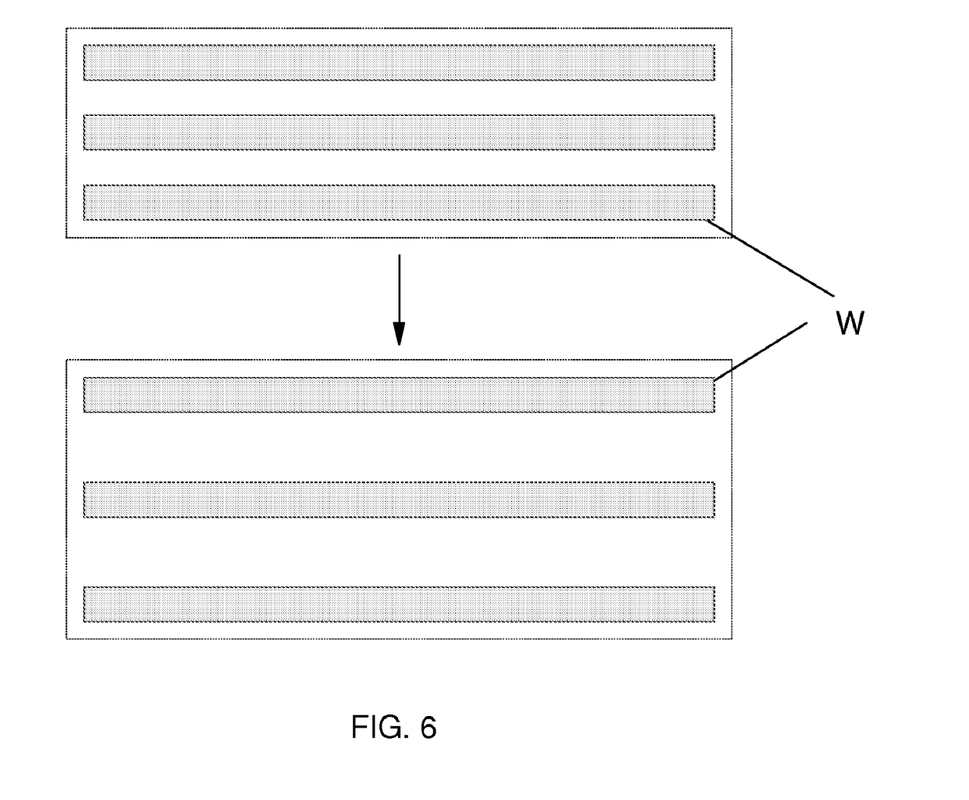

FIG. 6 shows another embodiment of the invention, which may be implemented alone or in combination with the above examples. In this embodiment, isolated wires "W" of any width are spread out to increase the wire to wire space. In this example, the wires "W" originally were 100 nm wide and spaced 100 nm may be spread out at a space of approximately 200 nm; although other spacing is also contemplated by the invention. Note that via placement may need to be adjusted. In embodiments, the via is dropped down to the spear wires such that wire to via shorts are avoided. Also, placing a larger via for good contact resistance becomes possible because there is room for a larger extend of metal.

To implement the embodiment of FIG. 6, a determination is made as to the distance between the wires as well as an overall dimension of the device and width of the wires. A determination may also be made as to whether shorting is possible, which may be based on previously gathered data now set forth in a table, for example. If the wiring is too close to one another and there is sufficient space on the device, the wires are spread apart.

Figure 7A:
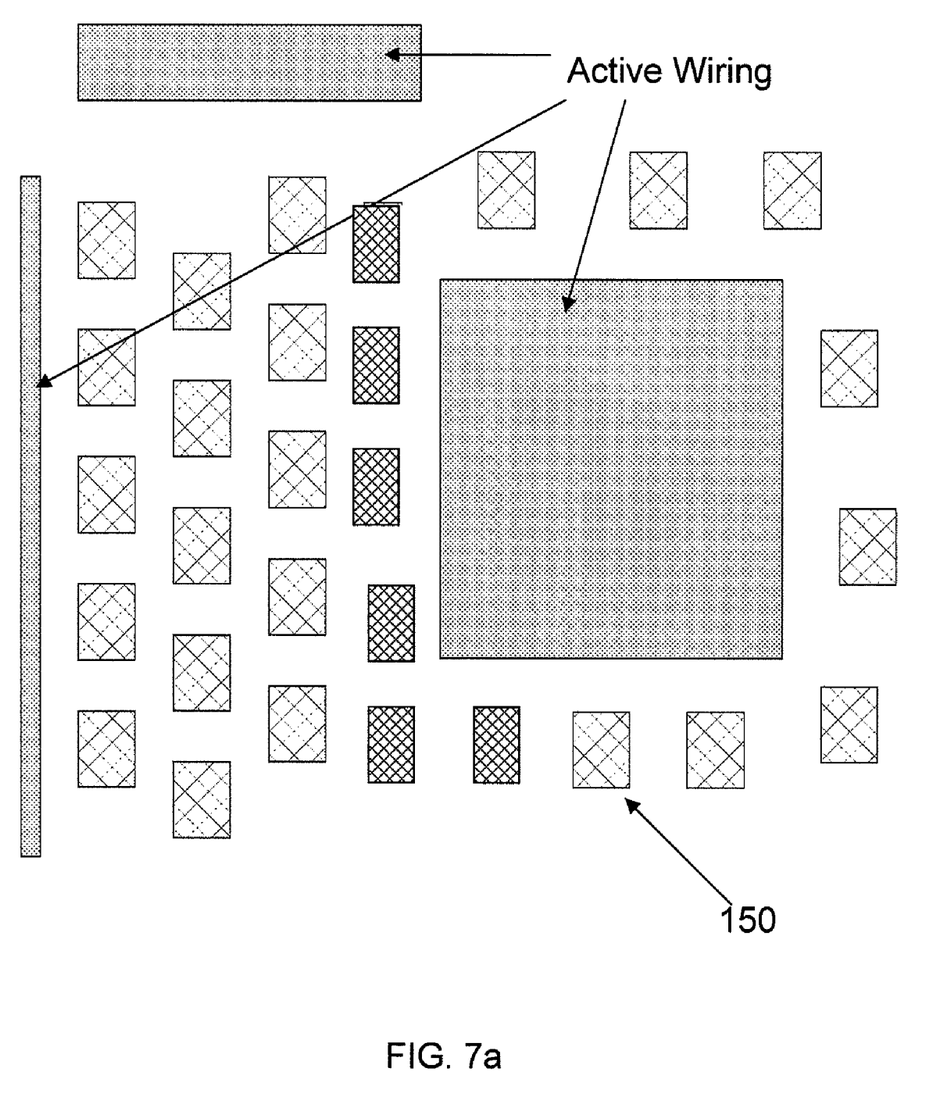
Figure 7B:
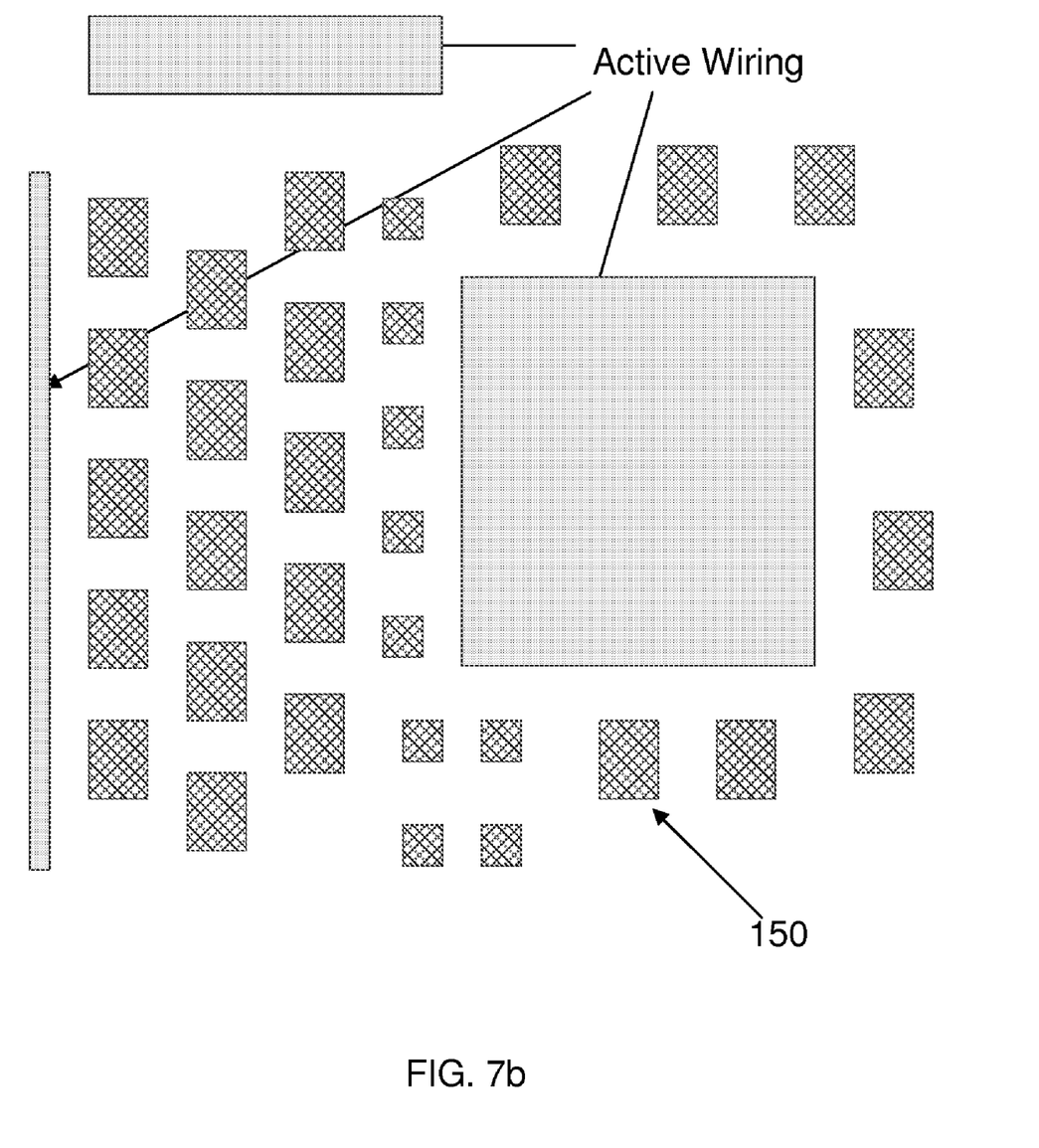

FIGS. 7a and 7b show another embodiment of the invention, which may be implemented alone or in combination with the above examples. In this embodiment, white space fill is varied to equalize the pattern factor. For example, dummy wiring shapes 150 can be varied in size and shape in order to fill in additional white space. This is accomplished by determining the amount of white space, and the size and location of the active wiring shapes. By knowing these parameters, the white space can be determined and filled in or equalized using different dummy wiring shapes, as opposed to the case when one size dummy fill shapes are used, which means that fill would not be inserted into spaces smaller than the dummy fill shape. FIG. 7a shows the filling of the white space with one fill size; whereas, the FIG. 7b shows the filling of the white space with two fill sizes.

Figure 8:
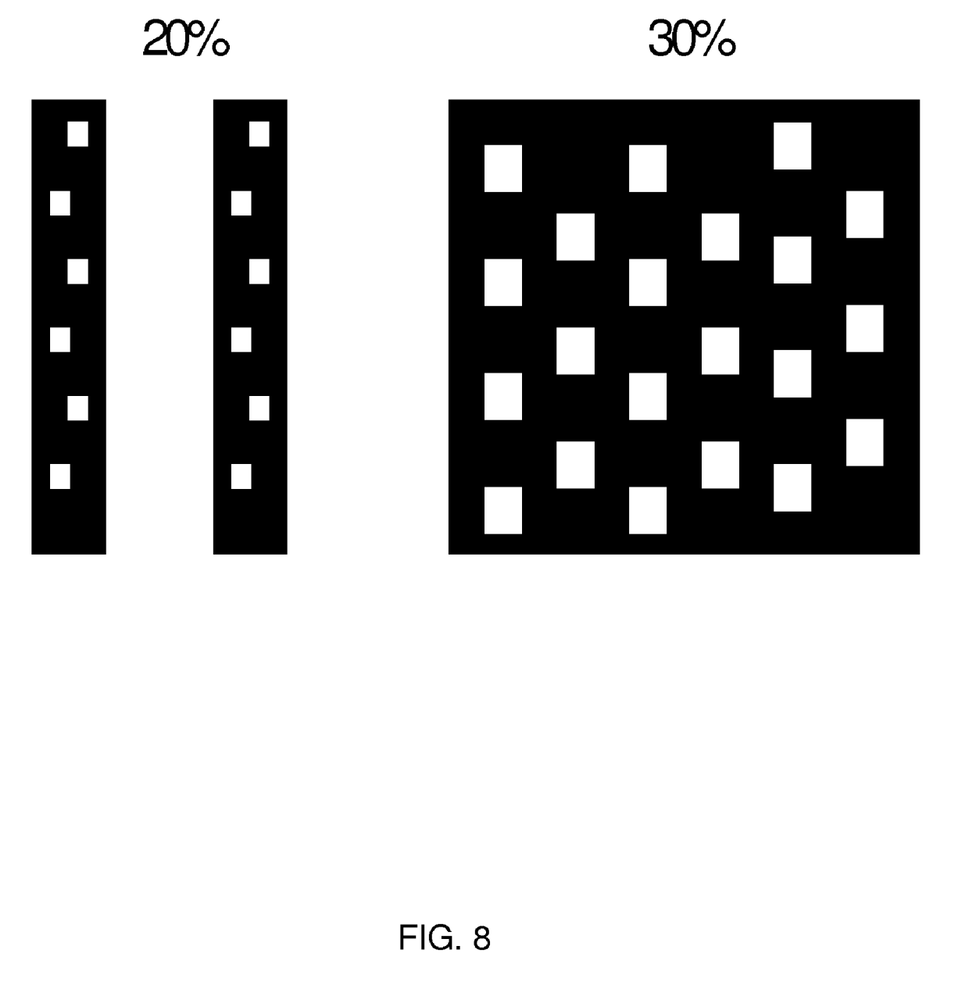

FIG. 8 shows another embodiment of the invention, which may be implemented alone or in combination with the above examples. In this embodiment, tiling, or the local removal of shapes inside wires, is locally varied to equalize the pattern factor in a fashion similar to the dummy shapes discussed regarding FIGS. 7a and 7b. In such embodiments, the tiling is locally applied in areas where wide wires or lots of wide wires are subject to erosion, in addition to causing topology problems on other layers, e.g., dishing. By way of one non-limiting illustrative example, the tiling removal density can be changed from 20% to 30% for a 50*50 um$^2$ pattern. In further embodiments, the tiling removal density would be increased from 20% to 30% if the global chip pattern factor post tiling is >=80%; or if wire width >25 um.

Figure 9A:
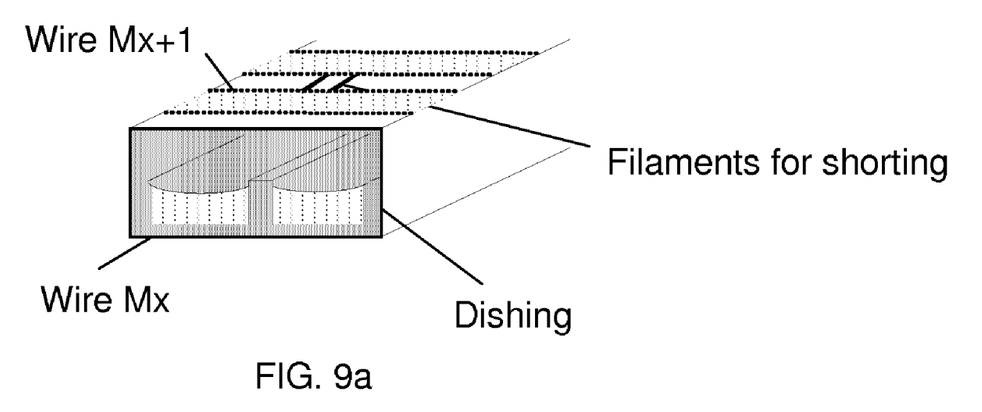
FIGS. 9a and 9b represent cross sectional views of a device.
Figure 9B:
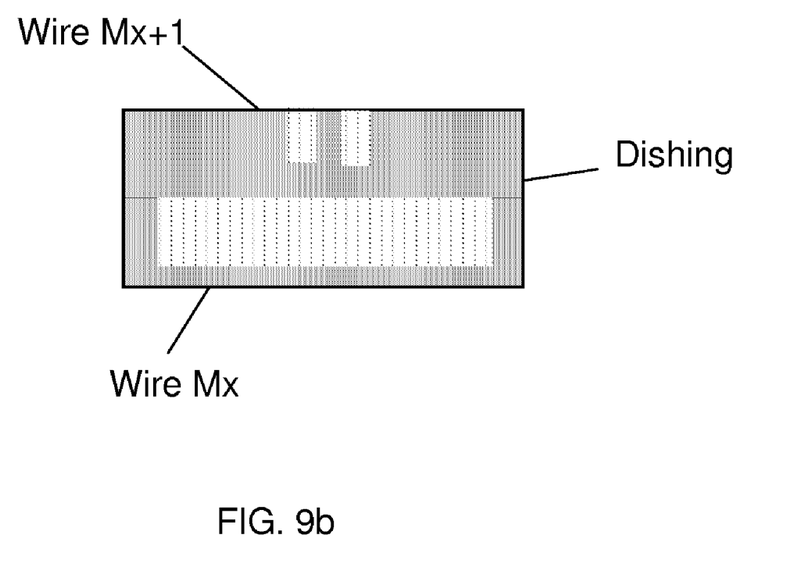

FIGS. 9a and 9b represent cross sectional views of a device. In FIG. 9a, a dishing or metal erosion at the Mx layer is shown, which results the generation of topography consisting of dielectric extending above the damascene wires and the metal in the damascene wire center extending below the metal at the damascene wire edge. This results in shorting between wires in the Mx+1 level due to the inability to remove excess metal during the chemical-mechanical polish (CMP) process employed. Referring to FIG. 9b, in embodiments, the space between the wires the Mx+2 level is locally increased to reduce the likelihood of shorting due to the dishing effect at the prior level Mx.

In a further example, M1-M6 level data prep can be provided to increase isolated wire width. For example, the following are illustrative embodiments increasing isolated wire widths:

M1: +14 nm or 28 nm per edge if space after change is >196 nm;

M2-M6: +14 nm or 28 nm per edge if space after change is >273 nm; and

MQ: +14 nm or 28 nm per edge if space after change is >553 nm.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed is:

1. A method for optimizing a circuit layout, comprising:
   stripping, by a processor, existing vias in a design layout;
   determining design parameters of the design layout including wiring placement and dimensions; and
   optimizing via layout by:
      placing vias away from edges of the wiring and adjacent vias, wherein the placing comprises reducing a width of the vias to effectively increase a spacing between adjacent vias or the edge of the wiring and the vias; and
   at least one of:
      moving the vias away from one another when they are a predetermined distance away from one another; and
      moving the vias when they are a predetermined distance from the edge of the wiring.

2. The method of claim 1, wherein the stripping step includes stripping the existing vias that are at least one of (i) placed near an edge of the wiring, (ii) densely packed and (iii) isolated.

3. The method of claim 1, wherein the optimizing step comprises converting two or more vias into a bar structure.

4. The method of claim 1, wherein the determining step comprises determining a number of existing vias and the location of the existing vias with respect to edges of the wiring and to one another.

5. The method of claim 1, wherein the optimizing step includes placement of the vias with respect to edges of the wiring and to one another to eliminate wire shorting and via to adjacent via shorting.

6. The method of claim 1, wherein the steps of claim 1 are implemented in fabrication of integrated circuit chips.

7. The method of claim 1, further comprising determining spacing between the wiring and spacing the wiring farther apart than an original spacing.

8. The method of claim 1, wherein the optimizing step implements post layout data preparation to optimize circuit layout to reduce random and systematic wire/via opens and shorts.

9. The method of claim 1, wherein:
   the determining step comprises at least one of:
      determining whether any existing via is near an edge of the wiring and a distance between the edge of the wiring and the existing via structure; and
      determining whether any existing via structure is near another existing via and the distance therebetween.

10. The method of claim 1, further comprising varying white space fill to equalize a pattern factor.

11. The method of claim 10, wherein the varying step includes providing dummy wiring shapes of various sizes and shapes.

12. The method of claim 1, further comprising varying cheesing density to equalize a pattern factor.

13. The method of claim 1, further comprising locally reduced a wiring width in a lower level wiring to eliminate dishing effects and to smooth a topography to eliminate shorting in an upper level wiring.

14. A system for optimizing a circuit layout and implemented in hardware, comprising:
at least one device configured to:
  determine design parameters of the design layout including wiring placement and dimensions; and
  optimize via layout by:
    placing vias away from edges of the wiring and adjacent vias, wherein the placing comprises reducing a width of the vias to effectively increase a spacing between adjacent vias or an edge of the wiring and the vias; and
    at least one of:
      moving the vias away from one another when they are a predetermined distance away from one another; and
      moving the vias when they are a predetermined distance from the edge of the wiring.

15. The system of claim 14, wherein the system is implemented on a computer readable storage medium.

16. The system of claim 14, wherein the optimized via layout is stored on a computer readable medium.

17. The system of claim 14, further comprising determining sizes of dummy fill shapes to fill white space.

18. The system of claim 17, wherein the sizes of the dummy fill shapes are different shapes to optimize fill space.

19. A computer program product for optimizing a circuit layout comprising a computer usable storage medium having readable program code embodied in the storage medium, the computer program product includes at least one component operable to:
strip existing vias in a design layout;
determine design parameters of the design layout including wiring placement and dimensions; and
optimize via layout by:
  placing vias away from edges of the wiring and adjacent vias, wherein the placing comprises reducing a width of the vias to effectively increase a spacing between adjacent vias or an edge of the wiring and the vias; and
  at least one of:
    moving the vias away from one another when they are a predetermined distance away from one another; and
    moving the vias when they are a predetermined distance from the edge of the wiring.

* * * * *